(12) United States Patent
Yeh et al.

(10) Patent No.: US 10,790,028 B1
(45) Date of Patent: Sep. 29, 2020

(54) AND TYPE FLASH MEMORY

(71) Applicant: MACRONIX International Co., Ltd., Hsinchu (TW)

(72) Inventors: Teng-Hao Yeh, Hsinchu County (TW); Hang-Ting Lue, Hsinchu (TW); Lee-Yin Lin, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/576,652

(22) Filed: Sep. 19, 2019

(51) Int. Cl.
| | |
|---|---|
| *G11C 16/24* | (2006.01) |
| *G11C 5/02* | (2006.01) |
| *H01L 27/11582* | (2017.01) |
| *H01L 27/11556* | (2017.01) |
| *G11C 5/06* | (2006.01) |

(52) U.S. Cl.
CPC ............ *G11C 16/24* (2013.01); *G11C 5/02* (2013.01); *G11C 5/06* (2013.01); *H01L 27/11556* (2013.01); *H01L 27/11582* (2013.01)

(58) Field of Classification Search
CPC .. G11C 16/24; G11C 5/02; G11C 5/06; H01L 27/11582; H01L 27/11556
USPC ........................................................ 365/185.12
See application file for complete search history.

(56) References Cited

U.S. PATENT DOCUMENTS

| | | | | |
|---|---|---|---|---|
| 6,498,752 | B1 * | 12/2002 | Hsu ...................... | G11C 16/16 365/185.18 |
| 8,824,232 | B2 * | 9/2014 | Yoo ........................ | G11C 7/12 365/203 |
| 2010/0091576 | A1 * | 4/2010 | Kwon ................ | G11C 16/3427 365/185.25 |

* cited by examiner

*Primary Examiner* — Fernando Hidalgo
(74) *Attorney, Agent, or Firm* — J.C. Patents

(57) ABSTRACT

An AND type flash memory includes a memory cell array, a plurality of page buffers and a plurality of voltage shifting circuits. The memory cell array is coupled to a plurality of bits lines and source lines. The page buffers are respectively coupled to the bit lines through a plurality of switches, and respectively provides a plurality of control signals. The control signals are transited between a first voltage and a reference voltage. The voltage shifting circuits respectively receive the control signals, generates a plurality of driving signals by shifting voltage values of the control signals, and provides the driving signals to the bit lines. Wherein, the driving signals are transited between a second voltage and the reference voltage, the second voltage is larger than the first voltage.

16 Claims, 10 Drawing Sheets

AND TYPE FLASH MEMORY

BACKGROUND OF THE INVENTION

1. Field of the Invention

The present invention relates to an AND type flash memory, in particular to an AND type flash memory with a multi-dimensional memory cell array.

2. Description of Related Art

With the progress of electronic technology, electronic devices have become an important tool in people's life. In electronic devices, the installation of high-quality nonvolatile memory elements is an important topic in this field.

Among conventional nonvolatile memories, flash memories are frequently used in recent years. Common flash memories include an NAND type flash memory, an NOR type flash memory and a newly issued AND type flash memory. The AND type flash memory can be applied to a multi-dimensional flash memory cell array, wherein in the prior art, when an AND type flash memory cell is erased or programmed, in terms of an enabled bit line to which the memory cell belongs, the bit line and a source line need to be short-circuited with each other, and a required driving voltage is applied according to whether the bit line is inhibited or not.

Further, in the prior art, the above driving voltage is provided by a page buffer. During erasing operation or programming operation, the page buffer needs to provide a driving voltage with a relatively high voltage value according to whether the bit line is an inhibited bit line. However, the page buffer in the prior art can only provide a digital logic voltage, resulting in poor efficiency of the memory cell during programming and erasing.

SUMMARY OF THE INVENTION

The present invention is directed to an AND type flash memory, which improves efficiency of a programming operation and an erasing operation of a memory cell.

The AND type flash memory comprises a memory cell array, a plurality of page buffers and a plurality of level shifter circuits. The memory cell array is coupled to a plurality of bit lines. The page buffers are coupled to the bit lines through a plurality of switches respectively. The page buffers provide a plurality of control signals respectively. The control signals are transited between a first voltage and a reference voltage. The level shifter circuits are coupled to the bit lines and the page buffers respectively. The level shifter circuits receive the control signals respectively, generate a plurality of driving signals by shifting voltage values of the control signals, and provide the driving signals for the bit lines respectively. The driving signals are transited between a second voltage and the reference voltage, and the second voltage is larger than the first voltage.

Based on the above, in the present invention, the level shifter circuits are arranged between the page buffers and the bit lines. The level shifter circuits are used for generating the driving signals by shifting the voltage values of the control signals provided by the page buffers, so that a inhibited bit line has a high enough voltage value under the programming operation, and an erased bit line also has a high enough voltage value under the erasing operation. In this way, the erasing operation and programming operation of the memory cell are effectively performed to improve the working efficiency of the AND type flash memory.

In order to make the aforementioned features and advantages of the present invention comprehensible, embodiments accompanied with figures are described in detail below.

DESCRIPTION OF THE EMBODIMENTS

Figure 1:
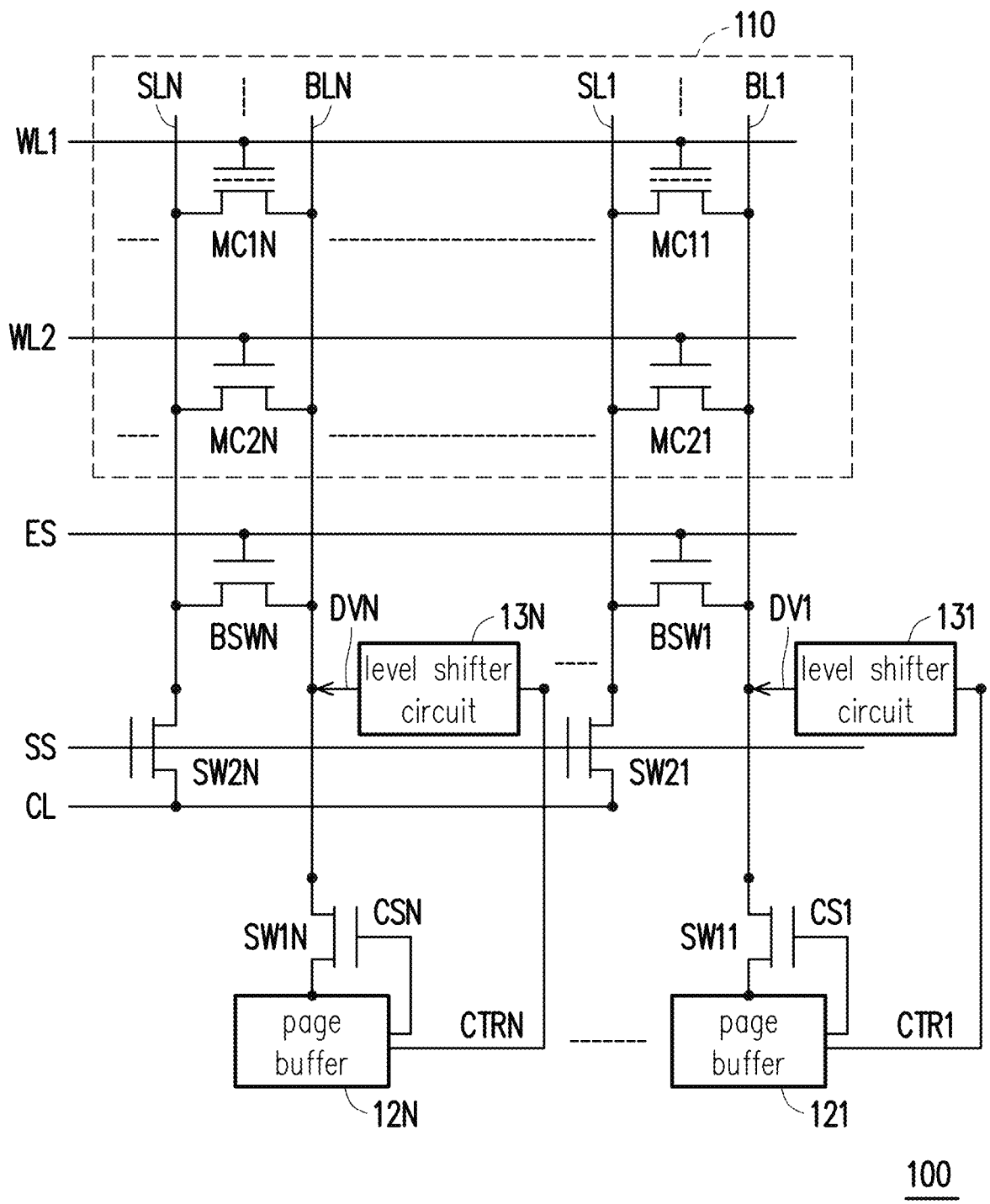
FIG. 1 is a schematic diagram of an AND type flash memory according to an embodiment of the present invention.

Refer to FIG. 1, which is a schematic diagram of an AND type flash memory according to an embodiment of the present invention. The AND type flash memory 100 comprises a memory cell array 110, a plurality of page buffers 121-12N and a plurality of level shifter circuits 131-13N. The memory cell array 110 comprises a plurality of memory cells MC11-MC2N and is coupled to a plurality of bit lines BL1-BLN and a plurality of source lines SL1-SLN. In the present embodiment, the memory cells MC11-MC1N are coupled to a word line WL1 together, and the memory cells MC21-MC2N are coupled to a word line WL2 together. In addition, the bit lines BL1-BLN correspond to the source lines SL1-SLN respectively, and the AND type flash memory 100 further comprises a plurality of equalization switches BSW1-BSWN, wherein the equalization switches BSW1-BSWN are coupled between the bit lines BL1-BLN and the source lines SL1-SLN respectively. The equalization switches BSW1-BSWN are turned on or off according to equalization control signals ES.

In the present embodiment, the page buffers 121-12N are coupled to the bit lines BL1-BLN through switches SW11-SW1N respectively, wherein the page buffers 121-12N respectively generate control signals CS1-CSN which are used for controlling the ON or OFF states of the switches SW11-SW1N. The source lines SL1-SLN are coupled to a common source line CL through switches SW21-SW2N respectively. The source lines SL1-SLN are turned on or off according to source line selection signals SS.

It should be noted that the level shifter circuits 131-13N are coupled to the page buffers 121-12N respectively and to the bit lines BL1-BLN. The level shifter circuits 131-13N receive control signals CTR1-CTRN generated by the page buffers 121-12N respectively, and generate driving signals DV1-DVN based on the control signals CTR1-CTRN respectively. The level shifter circuits 131-13N transmit the driving signals DV1-DVN to the corresponding bit lines BL1-BLN respectively. It should be particularly noted that in the present embodiment, the control signals CTR1-CTRN are transited between a first voltage and a reference voltage, while the driving signals DV1-DVN are transited between a second voltage and the reference voltage, wherein the second voltage is greater than the first voltage. The reference voltage is a grounding voltage, for example, 0 volt.

Further, taking the level shifter circuit 131 as an example, if the page buffer 121 transmits the control signal CTR1 equal to the reference voltage to the level shifter circuit 131, the level shifter circuit 131 generates the driving signal DV1 equal to the second voltage and provides the driving signal DV1 equal to the second voltage for the bit line BL1. If the page buffer 121 transmits the control signal CTR1 equal to the first voltage to the level shifter circuit 131, the level shifter circuit 131 generates the driving signal DV1 equal to the reference voltage and provides the driving signal DV1 equal to the reference voltage for the bit line BL1.

Further, when the memory cell array 100 performs the erasing operation or the programming operation, the equalization switches BSW1-BSWN are turned on according to the equalization control signals ES, and the corresponding bit lines and source lines (e.g., the bit line BL1 and the source line SL1) are short-circuited with each other. Meanwhile, the level shifter circuits 131-13N provide the appropriate driving voltages DV1-DVN for the corresponding bit lines BL1-BLN according to whether the corresponding bit lines are inhibited, programmed or erased.

In the present embodiment, the page buffers 121-12N divide codes according to data to be written by the memory cells on the corresponding bit lines BL-BLN, and generate the control signals CTR1 and CTRN accordingly. In addition, the page buffers 121-12N generate corresponding control signals CS1-CSN to control the ON or OFF states of the switches SW11-SW1N respectively while the programming operation or erasing operation of the memory cells is performed.

Details of the erasing operation, programming operation and reading operation of the AND type flash memory 100 are described in detail in the following embodiments. As for the hardware architecture of the page buffers 121-12N, the circuit architecture of the page buffers known to those of ordinary skill in the art is adopted, and there is no restriction on this.

In an embodiment of the present invention, the memory cell array 110 is a two-dimensional memory cell array or a three-dimensional memory cell array, and there is no restriction on this.

Figure 2:
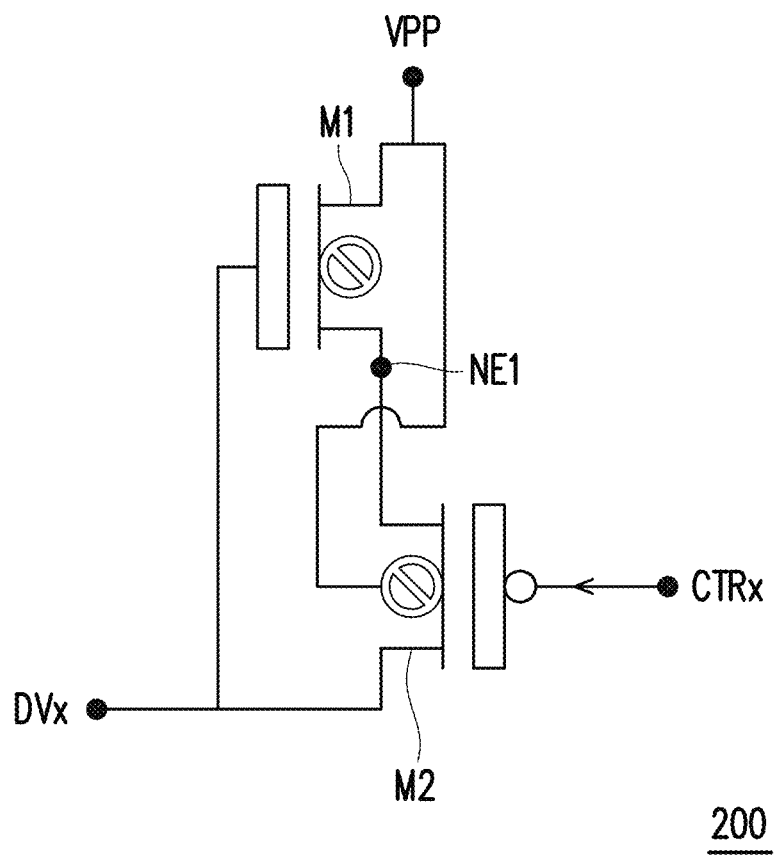
FIG. 2 is a schematic diagram of an implementation method of a level shifter circuit according to an embodiment of the present invention.

Refer to FIG. 2, which is a schematic diagram of an implementation method of a level shifter circuit according to an embodiment of the present invention. The level shifter circuit 200 comprises a transistor M1 and a transistor M2. The transistor M1 is provided with a first terminal receiving the second voltage VPP. A control terminal of the transistor M1 is coupled to the corresponding bit line and is used to receive the corresponding driving signal DVx. A second terminal of the transistor M1 is coupled to a first terminal (terminal NE1) of the transistor M2. A control terminal of the transistor M2 receives the corresponding driving signal CTRx. A second terminal of the transistor M2 is coupled to the corresponding bit line and provides the corresponding driving signal DVx. In addition, a base of the transistor M2 receives the second voltage VPP.

In the present embodiment, the transistor M1 is a depletion type N-type transistor, and the transistor M2 is an enhancement type P-type transistor. In an initial state, the voltage on the corresponding bit line (equal to the voltage of the driving signal DVx) is set to 0 volt. Under the condition that the control signal CTRx is 2.3 volts, the voltage on the terminal NE1 is gradually reduced until the transistor M2 is turned off, and floating of the terminal NE1 is realized. Under the condition that the critical voltage of the transistor M2 is −1.5 volts, the voltage on the terminal NE1 is maintained at about 3.8 volts. At this moment, the voltage difference Vgs_p between a gate and a source of the transistor M2 is VCTRx-VNE1, wherein VCTRx is the voltage value of the control signal CTRx and VNE1 is the voltage value on the terminal NE1.

Further, taking the voltage value of the second voltage VPP as an example, the voltage difference Vgs_n between a gate and a source of the transistor M1 is VDVx-VNE1, wherein VDVx is the voltage value of the driving signal DVx and is set to 0 volt in the initial state. Therefore, the voltage difference Vgs_n is equal to −VNE1. Under the conditions that the critical voltage of the transistor M1 is −2.8 volts and that the voltage value on the terminal NE1 is approximately 3.8 volts, the transistor M1 is turned off.

On the other hand, when the voltage of the control signal CTRx received by the transistor M2 is changed to the reference voltage (e.g., 0 volt), the transistor M2 is turned on and the voltage value VNE1 on the terminal NE1 is equal to 3.8 volts+ΔVx, wherein ΔVx is a voltage value provided by positive feedback generated when the transistor M2 is turned on. At this moment, the current Ip flowing through the transistor M2 is ΔVx×Gm_P, wherein Gm_P is the transduction value of the transistor M2.

With the current Ip being generated on the transistor M2, the voltage value VDVx of the driving signal DVx rises, wherein the voltage value VDVx=ΔVx×Gm_P×Rp, wherein Rp is a resistance value provided by the transistor M2. Then, the transistor M1 is turned on and provides a discharge path, wherein the discharge current In provided by the transistor M1 is equal to DVx×Gm_P×Rp×Gm_n. In this way, the voltage value VNE1 on the terminal NE1 is equal to DVx×Gm_P×Rp×Gm_n×Rn.

It can be seen from the above description that the positive feedback provided by the transistor M2 which is turned on makes the driving signal DVx and the voltages VDVx and VNE1 on the terminal NE1 rise rapidly, and makes the driving signal DVx and the voltages VDVx and VNE1 on the terminal NE1 equal to the second voltage VPP, and provides the driving signal DVx with a high enough voltage value for the bit lines.

It should be noted herein that the level shifter circuit 200 shown in FIG. 2 is only an example of implementation and is not intended to limit the scope of the present invention. In fact, any level shifter circuit known to those skilled in the art is used in the present invention.

Figure 3A:
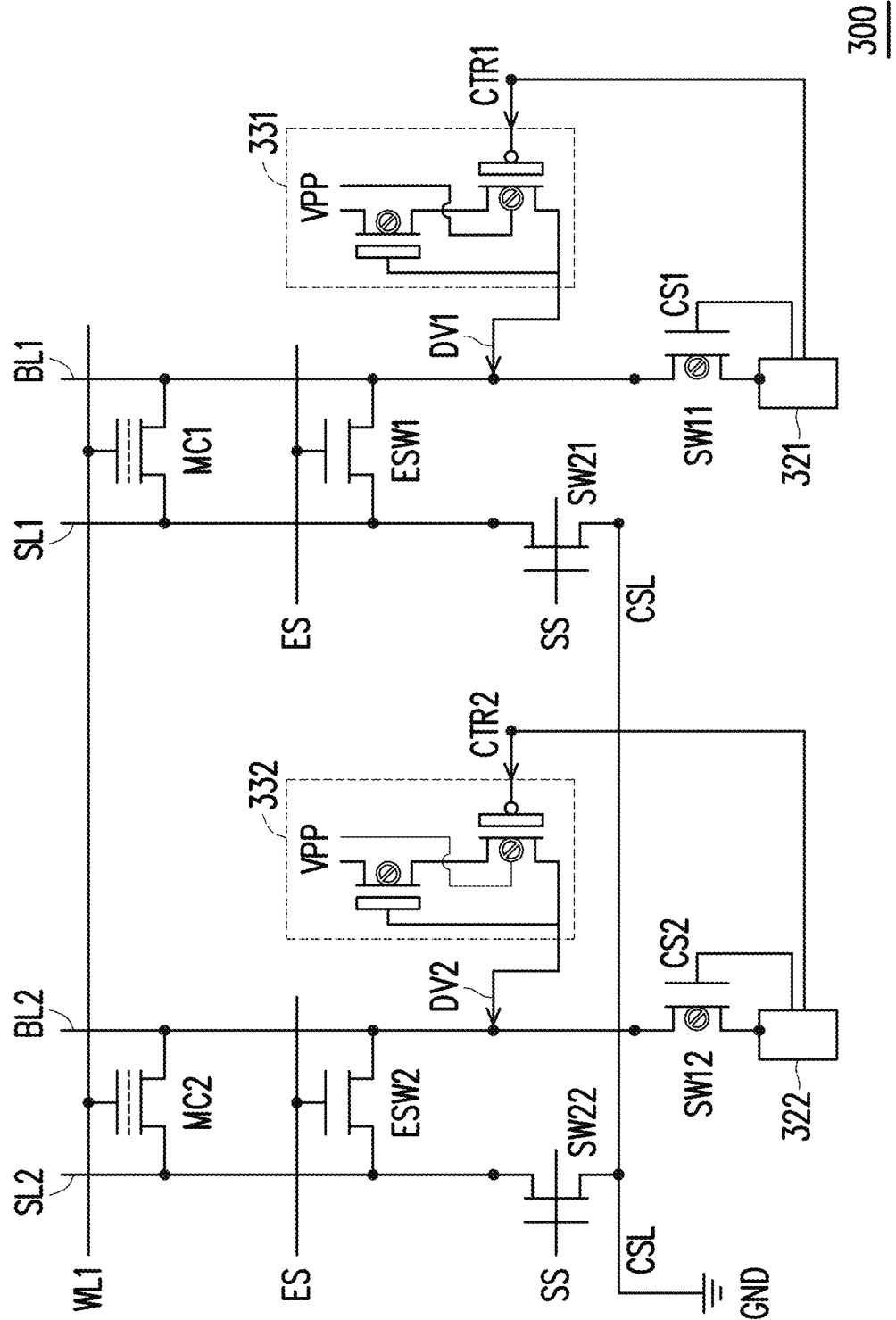
FIGS. 3A to 3D are schematic diagrams illustrating a plurality of different operation modes of the AND type flash memory according to an embodiment of the present invention.

Refer to FIGS. 3A to 3D, which are schematic diagrams illustrating a plurality of different operation modes of the AND type flash memory according to an embodiment of the present invention. In FIG. 3A, in the AND type flash memory 300, the memory cell array 310 comprises a plurality of memory cells MC1 and MC2, the memory cell MC1 is coupled between the bit line BL1 and the source line SL1, and the memory cell MC2 is coupled between the bit line BL2 and the source line SL2. In addition, the equalization switches BSW1 and BSW2 correspond to the memory cells MC1 and MC2 respectively. The equalization switch BSW1 is coupled between the bit line BL1 and the source line SL1, while the equalization switch BSW1 is coupled between the bit line BL2 and the source line SL2.

In the present embodiment, the level shifter circuits 331 and 332 are coupled to the bit lines BL1 and BL2 respectively, and are coupled to the page buffers 321 and 322 respectively. The level shifter circuits 331 and 332 receive the control signals CTR1 and CTR2 generated by the page buffers 321 and 322 respectively, and generate the driving signals DV1 and DV2 according to the control signals CTR1 and CTR2 respectively, wherein the driving signals DV1 and DV2 are provided for the bit lines BL1 and BL2 respectively.

In the present embodiment, the page buffers 321 and 322 are coupled to the bit lines BL1 and BL2 through the switches SW11 and SW12 respectively. The page buffers 321 and 322 provide the control signals CS1 and CS2 respectively, to control the switches SW11 and SW12 to be turned on or off.

In FIG. 3A, the AND type flash memory 300 performs initialization operation first, the switches SW21 and SW22 are turned on according to the source line selection signals SS, and the common source line CSL is coupled to the reference voltage GND. Meanwhile, the equalization switches ESW1 and ESW2 are turned on according to the equalization control signals ES, so that the bit lines BL1 and BL2 and the source lines SL1 and SL2 are equalized to the reference voltage GND.

Incidentally, the switches SW11 and SW12 are turned off during the initialization operation. The equalization control signals ES, the source line selection signals SS, and the word line signal WL1 are all generated by a controller inside the AND type flash memory 300. The controller inside the AND type flash memory 300 is implemented through memory control circuits well known to those of ordinary skill in the art, and is not particularly limited.

Figure 3B:
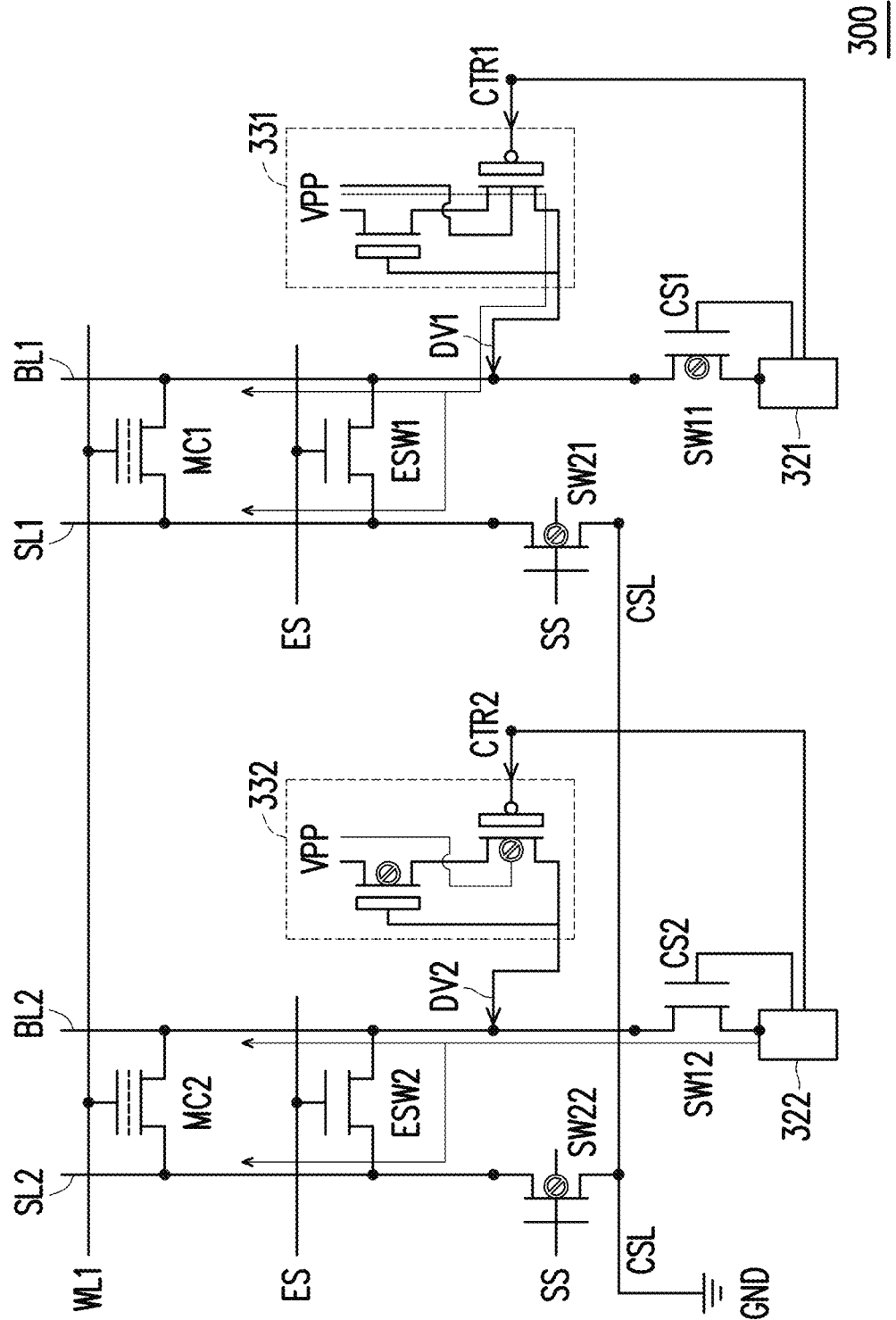

Next, referring to FIG. 3B, in the programming operation (e.g., a page-based programming operation), for example, when the memory cell MC1 is an inhibited memory cell and the memory cell MC2 is a programmed memory cell, the bit line BL1 is an inhibited bit line and the bit line BL2 is a programmed bit line. The equalization switches ESW1 and ESW2 are turned on, making the bit line BL1 and the source line SL1 short-circuited with each other, and the bit line BL2 and the source line SL2 short-circuited with each other. In addition, the page buffer 322 provides the control signal CS2 to turn on the switch SW12, and the page buffer 321 provides the control signal CS1 to turn off the switch SW11. In addition, the switches SW21 and SW22 are turned on, and the common source line CSL is coupled to the reference voltage GND.

On the other hand, the page buffers 321 and 322 provide the control signal CTR2 of 2.3 volts (the voltage value of the first voltage) for the level shifter circuit 332, and the control signal CTR1 of 0 volt (transited from 2.3 volts to 0 volt) for the level shifter circuit 331 respectively. Under the condition that the second voltage VPP received by the level shifter circuits 331 and 332 is 8 volts, the level shifter circuit 331 generates the driving signal DV1 of 8 volts, and the level shifter circuit 332 generates the driving signal DV2 of 0 volt. By supplying a voltage of, for example, 16-22 volts to the word line WL1, the memory cell MC2 is programmed and the memory cell MC1 is inhibited, so as to maintain internally stored data.

Herein, when the programming operation is performed, the level shifter circuit 331 accepts a programmed mask voltage (e.g., 8 volts) as the second voltage VPP and provides the same for the corresponding bit line BL1 and source line SL1 to complete a masking operation.

Figure 3C:
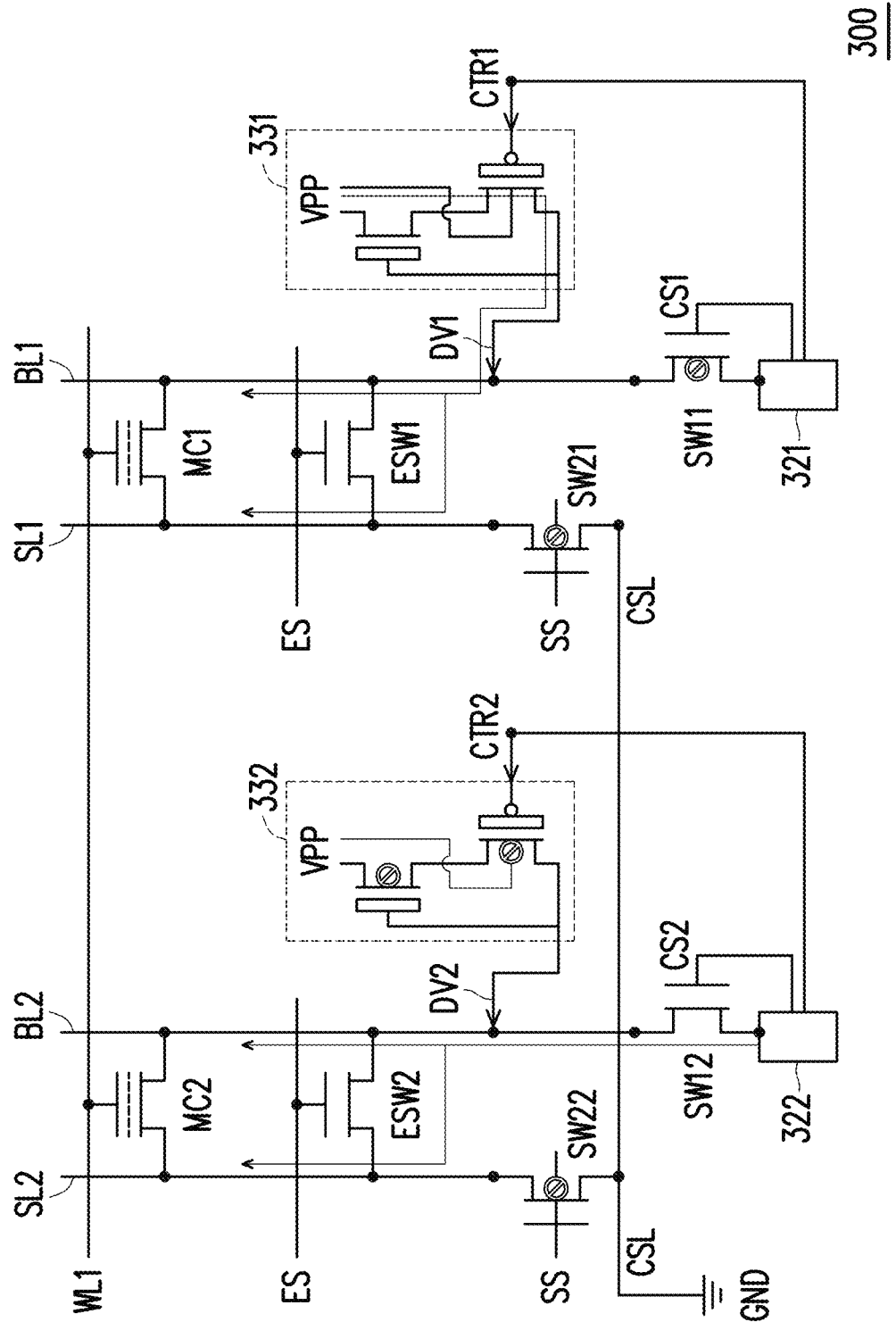

In FIG. 3C, during the erasing operation, for example, when the memory cell MC2 is an inhibited memory cell and the memory cell MC1 is an erased memory cell, the level shifter circuits 331 and 332 receive the second voltage VPP which is an erase voltage (e.g., 10 volts), wherein the erase voltage is higher than the aforementioned programmed mask voltage. In addition, the switches SW21 and SW22 are turned off. However, the equalization switches ESW1 and ESW2 are turned on, making the bit line BL1 and the source line SL1 short-circuited with each other, and the bit line BL2 and the source line SL2 short-circuited with each other. In addition, the page buffer 322 provides the control signal CS2 to turn on the switch SW12, and the page buffer 321 provides the control signal CS1 to turn off the switch SW11.

On the other hand, the page buffers 321 and 322 provide the control signal CTR2 of 2.3 volts (the voltage value of the first voltage) for the level shifter circuit 332, and the control signal CTR1 of 0 volt (transited from 2.3 volts to 0 volt) for the level shifter circuit 331 respectively. In this way, the level shifter circuit 331 provides the driving signal DV1 equal to the second voltage VPP (for example, 10 volts) for the bit line BL1 according to the control signal CTR1 which is transited to 0 volt. The level shifter circuit 332 provides the driving signal DV2 equal to the reference voltage GND (for example, 0 volt) for the bit line BL2 according to the control signal CTR2 of 2.3 volts. By supplying a voltage (−6−−12 volts) to the word line WL1, the memory cell MC1 is erased and the memory cell MC2 is inhibited without being erased, thus completing the erasing operation of the AND memory 300.

Figure 3D:
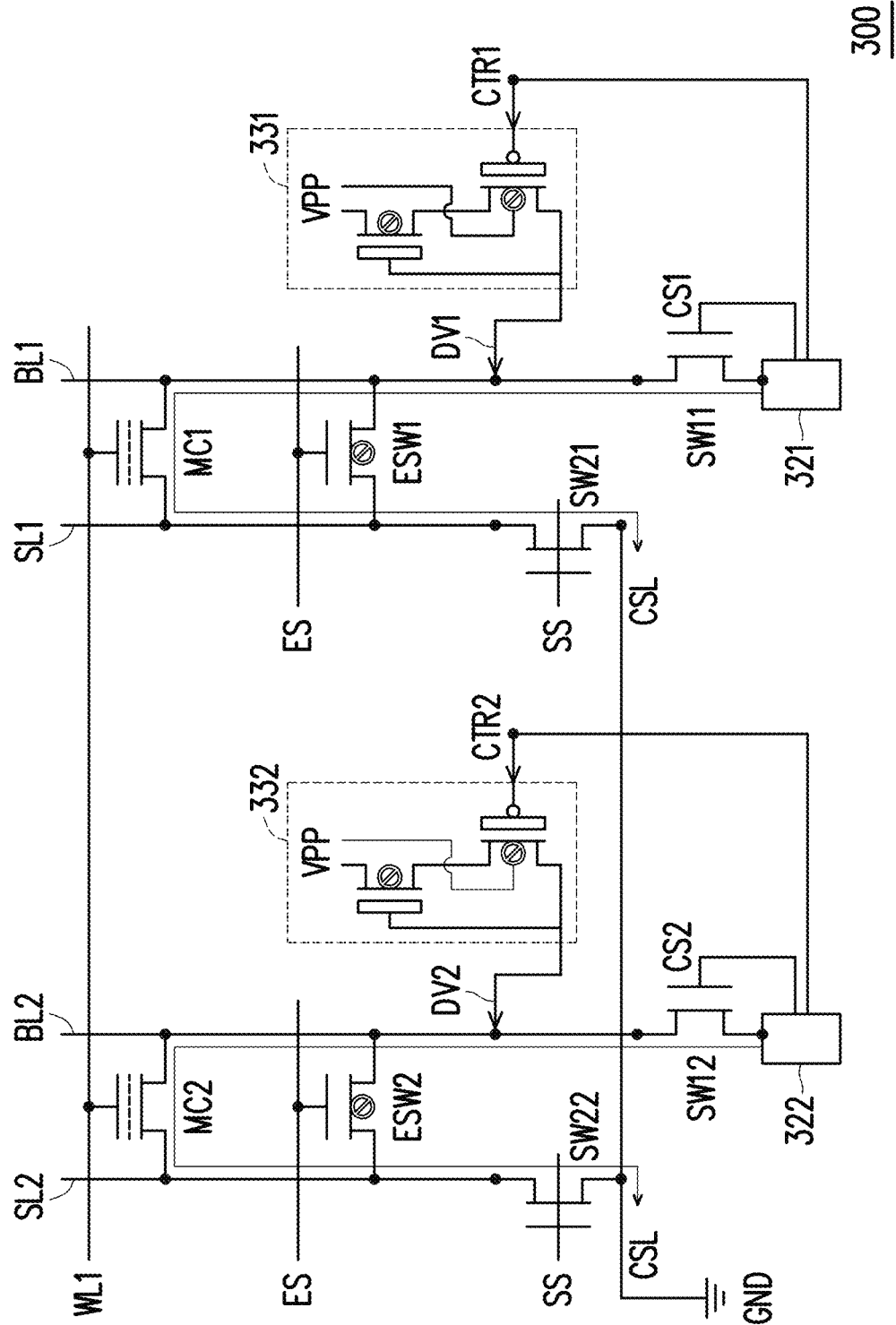

In FIG. 3D, during the reading operation, the switches SW21 and SW22 are turned on, the common source line CSL is coupled to the reference voltage GND, and the reference voltage GND is supplied to the source lines SL1 and SL2. The equalization switches ESW1 and ESW2 are turned off according to the equalization control signals ES, and the page buffers 321 and 322 provide the control signals CS1 and CS2 to turn on the switches SW11 and SW12 respectively. In the present embodiment, the transistors constructing the switches SW11 and SW12 are N-type transistors and are used as clamping transistors. Under the conditions that the critical voltage of the transistors constructing the switches SW11 and SW12 is 0.7 volt and that the control signals CS1 and CS2 are 1.5 volts, the voltages on the bit lines BL1 and BL2 are 0.8 volt.

On the other hand, the level shifter circuits 331 and 332 receive the control signals CTR1 and CTR2 equal to 2.3 volts and turn off the transistors in the level shifter circuits 331 and 332. Therefore, during the reading operation, the level shifter circuits 331 and 332 are disabled, thus being unable to affect the voltage value on the bit lines.

Through a current loop formed by the turned-on switch SW11, the memory cell MC1 and the turned-on switch SW21, the page buffer 321 senses the data stored in the memory cell MC1 through a sense amplifier to achieve the purpose of reading. Similarly, through a current loop formed by the turned-on switch SW21, the memory cell MC2 and the turned-on switch SW22, the page buffer 322 senses the data stored in the memory cell MC2 through the sense amplifier to achieve the purpose of reading.

Figure 4:
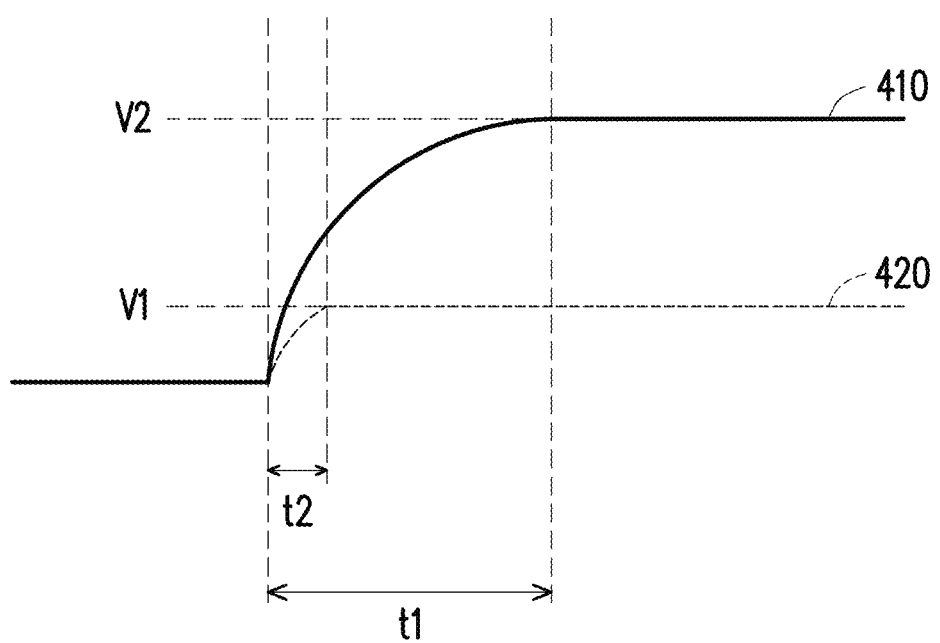
FIG. 4 is a schematic diagram showing the reaction speeds of bit lines and source lines of the AND type flash memory according to an embodiment of the present invention.

Referring now to FIG. 4, which is a schematic diagram illustrating the reaction speeds of bit lines and source lines of the AND type flash memory according to an embodiment of the present invention. As the AND type flash memory performs the programming operation or erasing operation, for example, when the bit lines and the source lines need to be pulled up to a voltage V2 (e.g., 10 volts) and the equivalent capacitance values on the bit lines and the source lines are both 0.78 picofarad (pF), from a voltage rise curve 410 of the bit lines and the source lines, it can be known that a set time t1 for the voltage rise of the bit lines and the source lines is about 1.04 microseconds. On the other hand, as the AND type flash memory performs the reading operation, for example, when the bit lines and the source lines need to be pulled up to a voltage V1 (e.g., 0.8 volt) and the equivalent capacitance values on the bit lines and the source lines are both 0.78 picofarad (pF), from a voltage rise curve 420 of the bit lines and the source lines, it can be known that a set time t2 for the voltage rise of the bit lines and the source lines is about 14 nanoseconds.

Figure 5:
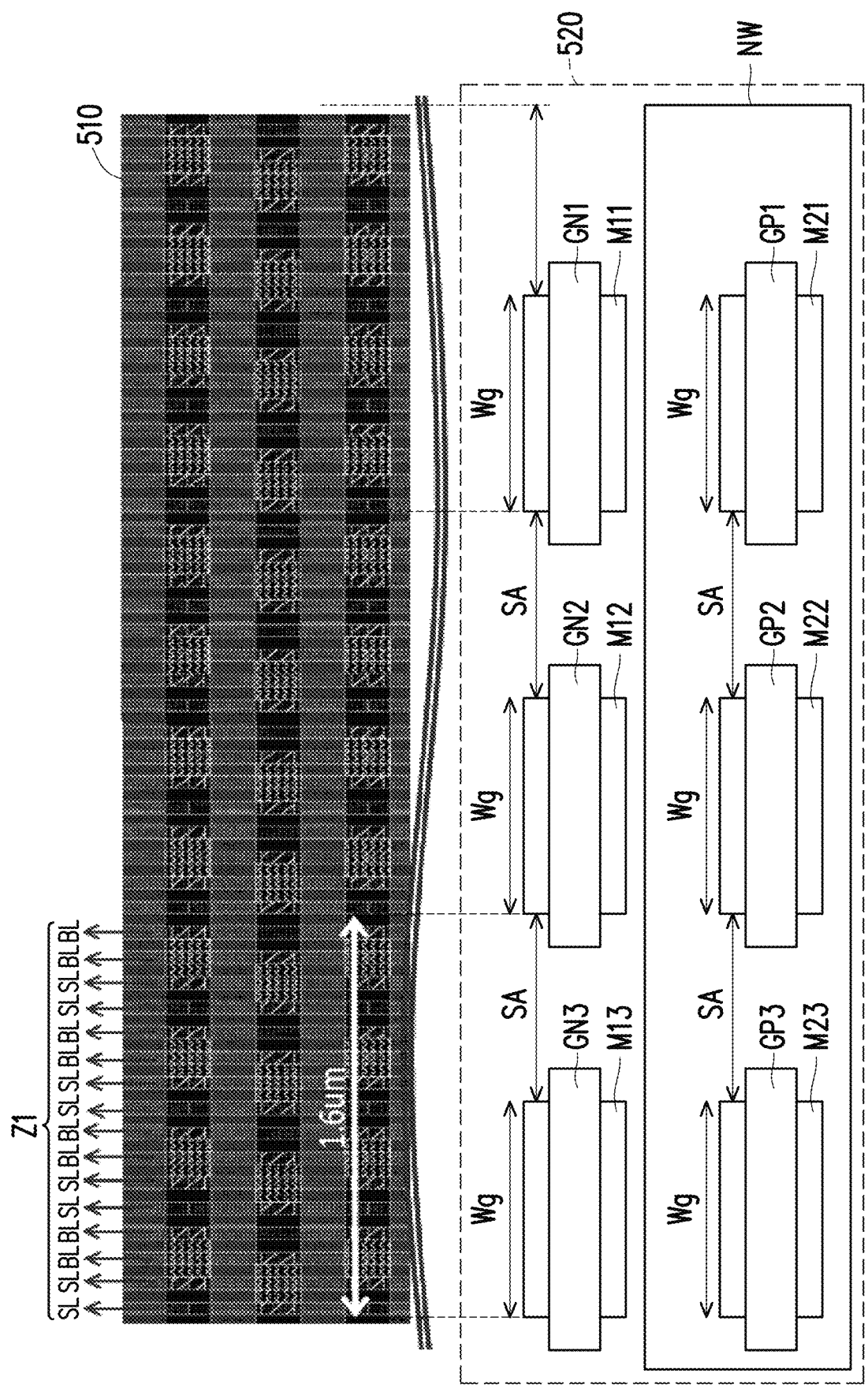
FIG. 5 is a schematic diagram of a local layout architecture of the AND type flash memory according to an embodiment of the present invention.

Refer to FIG. 5, which is a schematic diagram of a local layout architecture of the AND type flash memory according to an embodiment of the present invention. In FIG. 5, a plurality of level shifter circuits are arranged in a region 520. A plurality of N-type depletion transistors M11, M12, M13 and a plurality of P-type transistors M21, M22, M23 are arranged in the region 520. The transistors M11 and M21 form a first set of level shifter circuits. The transistors M12 and M22 form a second set of level shifter circuits. The transistors M13 and M23 form a third set of level shifter circuits. It should be noted that the transistors M21, M22 and M23 are arranged in the same N-well, and the area required for layout is reduced.

In the present embodiment, each set of level shifter circuits corresponds to a plurality of bit lines and source lines. In FIG. 5, a plurality of bit lines BL and source lines SL are alternately arranged in one region Z1. The third set of level shifter circuits formed by the transistors M13 and M23 is arranged corresponding to the region Z1. In the present embodiment, the transistors M11-M13 are provided with gate structures GN1-GN3 respectively, and have the same width Wg, 1 micron for example. In addition, the distance SA between the transistors M11-M13 is approximately equal to 0.6 micron. In addition, the transistors M21-M23 are provided with the gate structures GP1-GP3 respectively, and have the same width Wg, 1 micron for example. In addition, the distance SA between the transistors M21-M23 is approximately equal to 0.6 micron.

It is worth mentioning that the above layout and dimensions are only illustrative examples and are not intended to limit the scope of the present invention. Those of ordinary skill in the art can set the dimension and distance of the transistors according to process specifications and actual requirements without any specific restrictions.

Figure 6A:
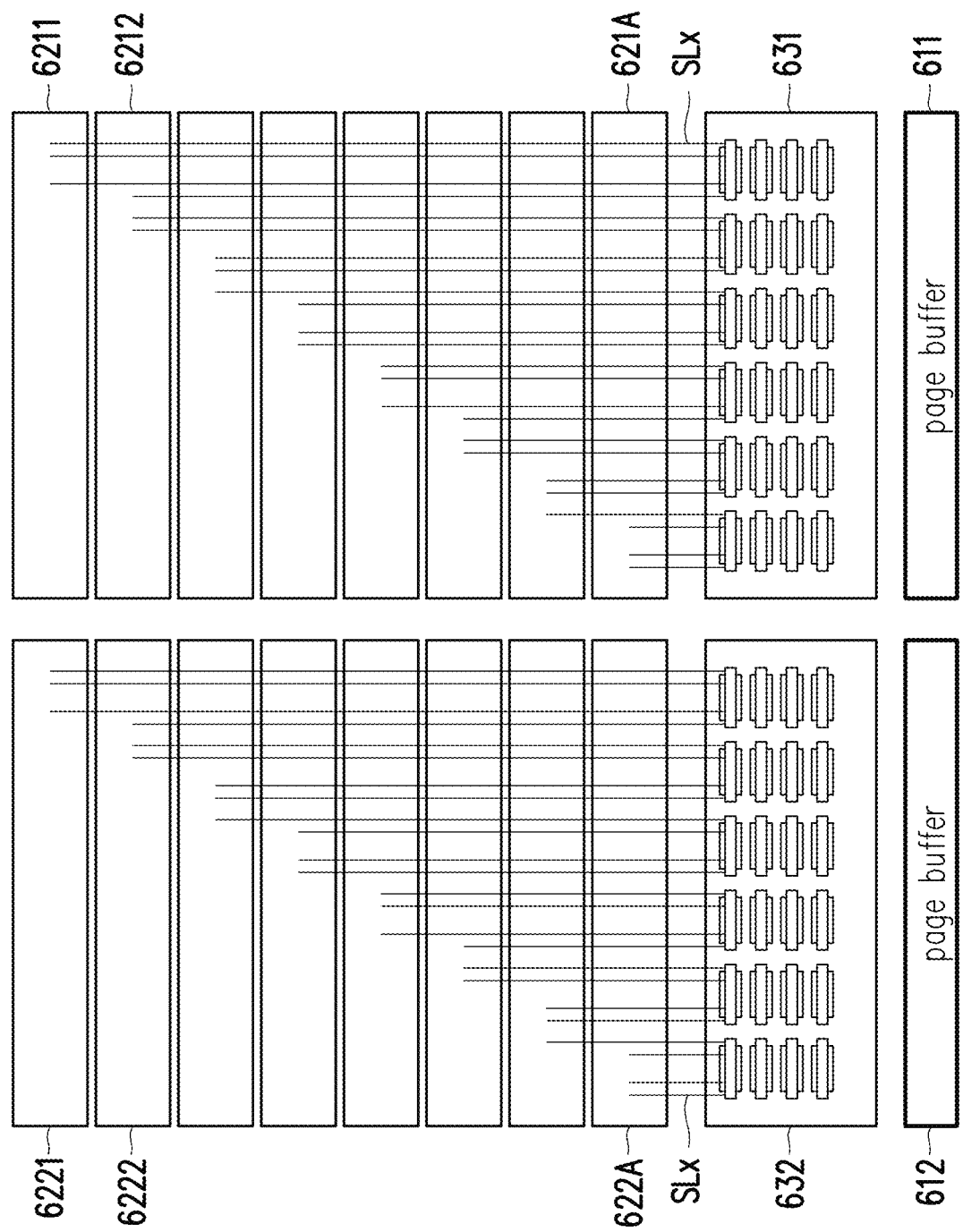
FIGS. 6A and 6B are schematic diagrams illustrating a local layout architecture of the AND type flash memory according to an embodiment of the present invention.
Figure 6B:
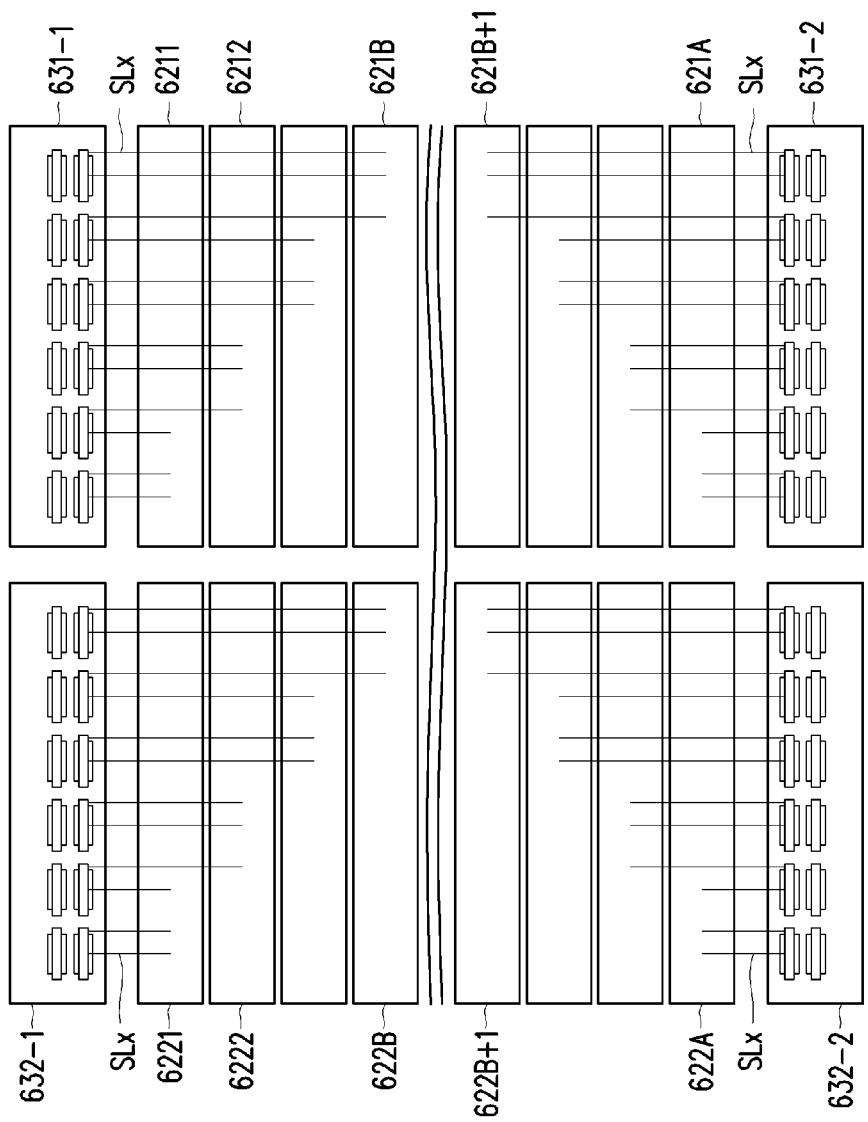

Refer to FIGS. 6A and 6B, which are schematic diagrams of local layout architectures of the AND type flash memory according to an embodiment of the present invention. In FIG. 6A, a plurality of equalization switches are arranged in regions 6211-621A and 6221-622A, and form a first layout region. The page buffers 611 and 612 are arranged in regions 6211-621A and 6221-622A respectively, so as to be in a second layout region. In addition, the level shifter circuits 631 and 632 correspond to the page buffers 611 and 612 respectively, so as to be arranged between the first layout region and the second layout region.

In addition, the first layout region is also used for the arrangement of a plurality of switches associated with the bit lines BLx and the source lines SLx, such as the switches SW21-SW2N and SW11-SW1N in the embodiment of FIG. 1.

In FIG. 6B, the regions 6211-621A used for the arrangement of the equalization switches are divided into regions 6211-621B and 621B+1-621A, and the regions 6221-622A are divided into regions 6221-622B and 622B+1-622A. The page buffers and the level shifter circuits correspond to the regions 6211-621B, 6221-622B, 621B+1-621A, and 622B+1-622A, so as to be divided into first sections 631-1, 632-1 and second sections 631-2, 632-2. The first sections 631-1 and 632-1 of the page buffers and the level shifter circuits are arranged on a first side edge of the first layout region for the arrangement of the equalization switches. The second sections 631-2 and 632-2 of the page buffers and the level shifter circuits are arranged on a second side edge of the first layout region for the arrangement of the equalization switches, wherein the first side edge is opposite to the second side edge.

To sum up, in the present invention, the level shifter circuits are arranged, the driving signals are generated according to the control signals provided by the page buffers when the AND type flash memory performs the programming operation or erasing operation. The driving signals are used to be supplied to the corresponding bit lines, and the memory cells are effectively programmed, erased or inhibited to ensure the correctness of the stored data.

Although the present invention has been disclosed by way of embodiments as above, they are not intended to limit the present invention. Those skilled in the art can make some changes and modifications without departing from the spirit or scope of the present invention. Therefore, the scope of protection of the present invention is to be determined by the scope of the appended claims.

What is claimed is:

1. An AND type flash memory, comprising:
   a memory cell array, coupled to a plurality of bit lines and a plurality of source lines;
   a plurality of page buffers, coupled to the bit lines through a plurality of switches respectively, and providing a plurality of control signals respectively, the control signals being transited between a first voltage and a reference voltage; and
   a plurality of level shifter circuits, coupled to the bit lines and the page buffers respectively, receiving the control signals and generating a plurality of driving signals by shifting voltage values of the control signals, and providing the driving signals for the bit lines,
   wherein the driving signals are transited between a second voltage and the reference voltage, and the second voltage is larger than the first voltage.

2. The AND type flash memory according to claim 1, further comprising:
   a plurality of equalization switches, coupled between the bit lines and the corresponding source lines,
   wherein a first equalization switch corresponding to a first bit line is turned on during a programming operation or an erasing operation.

3. The AND type flash memory according to claim 2, wherein in an equalization operation, the equalization switches are turned on, and the bit lines and the corresponding source lines receive the reference voltage.

4. The AND type flash memory according to claim 3, wherein a first level shifter circuit is coupled to the first bit line, the first equalization switch corresponding to the first bit line is turned on during the programming operation, and when the first bit line is an inhibited bit line, the first level shifter circuit makes the second voltage equal to a programmed mask voltage according to the corresponding first control signal and provides the first driving signal equal to the second voltage for the first bit line.

5. The AND type flash memory according to claim 4, wherein the first level shifter circuit is coupled to the first bit line, and the first level shifter circuit maintains the first bit line equal to the reference voltage when the first bit line is a programmed bit line during the programming operation.

6. The AND type flash memory according to claim 4, wherein the first equalization switch corresponding to the first bit line is turned on during the erasing operation, and when the first bit line is an erased bit line, the first level shifter circuit makes the second voltage equal to an erase voltage according to the corresponding first control signal and provides the first driving signal equal to the second voltage for the first bit line.

7. The AND type flash memory according to claim 6, wherein the erase voltage is higher than the programmed mask voltage.

8. The AND type flash memory according to claim 6, wherein the first equalization switch corresponding to the first bit line is turned on during the erasing operation, and the first level shifter circuit maintains the first bit line equal to the reference voltage when the first bit line is the inhibited bit line.

9. The AND type flash memory according to claim 1, wherein during a reading operation, each of the page buffers provides a read voltage for the corresponding bit line, and the level shifter circuits are disabled.

10. The AND type flash memory according to claim 1, wherein each of the level shifter circuits comprises:
   a first transistor provided with a first terminal receiving the second voltage, a control terminal of the first transistor being coupled to the corresponding bit lines to provide the corresponding driving signals; and
   a second transistor provided with a first terminal coupled to a second terminal of the first transistor, a control terminal of the second transistor receiving the corresponding control signals, a second terminal of the second transistor being connected to the corresponding bit lines, and a base of the second transistor receiving the second voltage.

11. The AND type flash memory according to claim 10, wherein the first transistor is a depletion type N-type transistor and the second transistor is a P-type transistor.

12. The AND type flash memory according to claim 11, wherein the second transistor of each of the level shifter circuits is arranged in the same N-well.

13. The AND type flash memory according to claim 11, wherein the memory cell array is a two-dimensional array or a three-dimensional array.

14. The AND type flash memory according to claim 2, wherein the equalization switches are arranged in a first layout region, the page buffers are arranged in a second layout region adjacent to the first layout region, and the level shifter circuits are arranged between the first layout region and the second layout region of the layout region.

15. The AND type flash memory according to claim 2, wherein the equalization switches are arranged in a first layout region, the level shifter circuits are divided into a first section and a second section, the first section of the level shifter circuits is arranged on a first side edge of the first layout region, the second section of the level shifter circuits is arranged on a second side edge of the first layout region, and the first side edge is opposite to the second side edge.

16. The AND type flash memory according to claim 15, wherein the page buffers correspond to the level shifter circuits, so as to be divided into a first section and a second section, the first section of the page buffers is arranged adjacent to the first section of the level shifter circuits, and the second section of the page buffers is arranged adjacent to the second section of the level shifter circuits.

* * * * *